United States Patent
So et al.

(10) Patent No.: US 7,057,958 B2
(45) Date of Patent: Jun. 6, 2006

(54) METHOD AND SYSTEM FOR TEMPERATURE COMPENSATION FOR MEMORY CELLS WITH TEMPERATURE-DEPENDENT BEHAVIOR

(75) Inventors: Kenneth So, Belmont, CA (US); Luca Fasoli, San Jose, CA (US); Bendik Kleveland, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 99 days.

(21) Appl. No.: 10/676,862

(22) Filed: Sep. 30, 2003

(65) Prior Publication Data
US 2005/0078537 A1  Apr. 14, 2005

(51) Int. Cl.
*G11C 7/04* (2006.01)
(52) U.S. Cl. .................. 365/211; 365/189.07; 365/207
(58) Field of Classification Search ................ 365/211, 365/189.07, 207, 189.01, 210, 242
See application file for complete search history.

(56) References Cited

U.S. PATENT DOCUMENTS

| | | | |
|---|---|---|---|
| 3,851,316 A | 11/1974 | Kodama | |
| 4,592,027 A | 5/1986 | Masaki | |
| 4,646,266 A | 2/1987 | Ovshinsky et al. | |
| 4,646,269 A | 2/1987 | Wong et al. | |
| 4,698,788 A | 10/1987 | Flannagan et al. | |
| 4,744,061 A | 5/1988 | Takemae et al. | |
| 4,873,669 A | 10/1989 | Furutani et al. | |
| 5,107,139 A | 4/1992 | Houston et al. | |
| 5,149,199 A | 9/1992 | Kinoshita et al. | |
| 5,276,644 A * | 1/1994 | Pascucci et al. | ....... 365/189.01 |
| 5,276,649 A | 1/1994 | Hoshita et al. | |
| 5,278,796 A | 1/1994 | Tillinghast et al. | |
| 5,359,571 A | 10/1994 | Yu | |
| 5,383,157 A | 1/1995 | Phelan | |
| 5,410,512 A | 4/1995 | Takase et al. | |
| 5,652,722 A | 7/1997 | Whitefield | |
| 5,784,328 A | 7/1998 | Irrinki et al. | |
| 5,818,748 A | 10/1998 | Bertin et al. | |
| 5,835,396 A | 11/1998 | Zhang | |
| 5,890,100 A | 3/1999 | Crayford | |
| 5,923,588 A | 7/1999 | Iwahashi | |
| 5,925,996 A | 7/1999 | Murray | |

(Continued)

OTHER PUBLICATIONS

"A 14ns 1Mb CMOS SRAM with Variable Bit-Organization," Wada et al., 1988 IEEE International Solid-State Circuits Conference, pp. 252-253 (Feb. 19, 1988).

(Continued)

*Primary Examiner*—David Lam
(74) *Attorney, Agent, or Firm*—Brinks Hofer Gilson & Lione

(57) ABSTRACT

The preferred embodiments described herein relate to a method and system for temperature compensation for memory cells with temperature-dependent behavior. In one preferred embodiment, at least one of a first temperature-dependent reference voltage comprising a negative temperature coefficient and a second temperature-dependent reference voltage comprising a positive temperature coefficient is generated. One of a wordline voltage and a bitline voltage is generated from one of the at least one of the first and second temperature-dependent reference voltages. The other of the wordline and bitline voltages is generated, and the wordline and bitline voltages are applied across a memory cell. Other methods and systems are disclosed for sensing a memory cell comprising temperature-dependent behavior, and each of the preferred embodiments can be used alone or in combination with one another.

33 Claims, 7 Drawing Sheets

U.S. PATENT DOCUMENTS

| | | |
|---|---|---|
| 5,940,340 A | 8/1999 | Ware et al. |
| 5,961,215 A | 10/1999 | Lee et al. |
| 5,977,746 A | 11/1999 | Hershberger et al. |
| 6,034,882 A | 3/2000 | Johnson et al. |
| 6,034,918 A | 3/2000 | Farmwald et al. |
| 6,055,180 A | 4/2000 | Gudesen et al. |
| 6,070,222 A | 5/2000 | Farmwald et al. |
| 6,157,244 A | 12/2000 | Lee et al. |
| 6,185,121 B1 | 2/2001 | O'Neill |
| 6,185,712 B1 | 2/2001 | Kirihata et al. |
| 6,205,074 B1 * | 3/2001 | Van Buskirk et al. ...... 365/211 |
| 6,208,545 B1 | 3/2001 | Leedy |
| 6,212,121 B1 | 4/2001 | Ryu et al. |
| 6,236,587 B1 | 5/2001 | Gudesen et al. |
| 6,240,046 B1 | 5/2001 | Proebsting |
| 6,246,610 B1 | 6/2001 | Han et al. |
| 6,335,889 B1 | 1/2002 | Onodera |
| 6,356,485 B1 | 3/2002 | Proebsting |
| 6,373,768 B1 | 4/2002 | Woo et al. |
| 6,385,074 B1 | 5/2002 | Johnson et al. |
| 6,407,953 B1 | 6/2002 | Cleeves |
| 6,420,215 B1 | 7/2002 | Knall et al. |
| 6,424,581 B1 * | 7/2002 | Bosch et al. ................ 365/195 |
| 6,507,238 B1 | 1/2003 | Yang |
| 6,525,953 B1 | 2/2003 | Johnson |
| 6,560,152 B1 | 5/2003 | Cernea |
| 6,577,549 B1 | 6/2003 | Tran et al. |
| 6,697,283 B1 * | 2/2004 | Marotta et al. ........ 365/185.21 |
| 6,724,665 B1 | 4/2004 | Scheuerlein et al. |
| 6,754,124 B1 | 6/2004 | Seyyedy et al. |
| 2002/0028541 A1 | 3/2002 | Lee et al. |
| 2002/0136045 A1 | 9/2002 | Scheuerlein |
| 2002/0136047 A1 | 9/2002 | Scheuerlein |
| 2003/0043643 A1 | 3/2003 | Scheuerlein et al. |
| 2003/0046020 A1 | 3/2003 | Scheuerlein |

OTHER PUBLICATIONS

"Partial Selection of Passive Element Memory Cell Sub-Arrays for Write Operation," U.S. Appl. No. 09/748,649, filed Dec. 22, 2000; inventors: Roy E. Scheuerlein and Matthew P. Crowley.

"64M x 8 Bit NAND Flash Memory," Samsung Electronics (Oct. 27, 2000).

"How Flash Memory Works," wysiwyg://8/http://www.howstuffworks.com/flash-memory.htm?printable=1, 5 pages (1998).

"Datalight FlashFX™ 4.06 User's Guide," p. 11 (Aug. 2000).

"How Does TrueFFS® manage Wear Leveling?," http://www.m-sys.com/content/information/calcInfo.asp, 2 pages (printed Oct. 5, 2001).

"A CMOS Bandgap Reference Circuit with Sub-1V Operation," IEEE Journal of Solid-State Circuits, vol. 34, No. 5, May 1999, pp. 670-674.

"Sub-1V CMOS Proportional to Absolute Temperature References," IEEE Journal of Solid-State Circuits, vol. 38, No. 1, Jan. 2003, pp. 85-89.

"The flash memory read path: building blocks and critical aspects," Micheloni et al., Proceedings of the IEEE, vol. 91, No. 4, Apr. 2003, pp. 537-553.

"A current-based reference-generations scheme for 1T-1C ferroelectric random-access memories," Siu et al., IEEE Journal of Solid-State Circuits, vol. 38, Issue 3, Mar. 2003, pp. 541-549.

* cited by examiner

*Fig. 4*
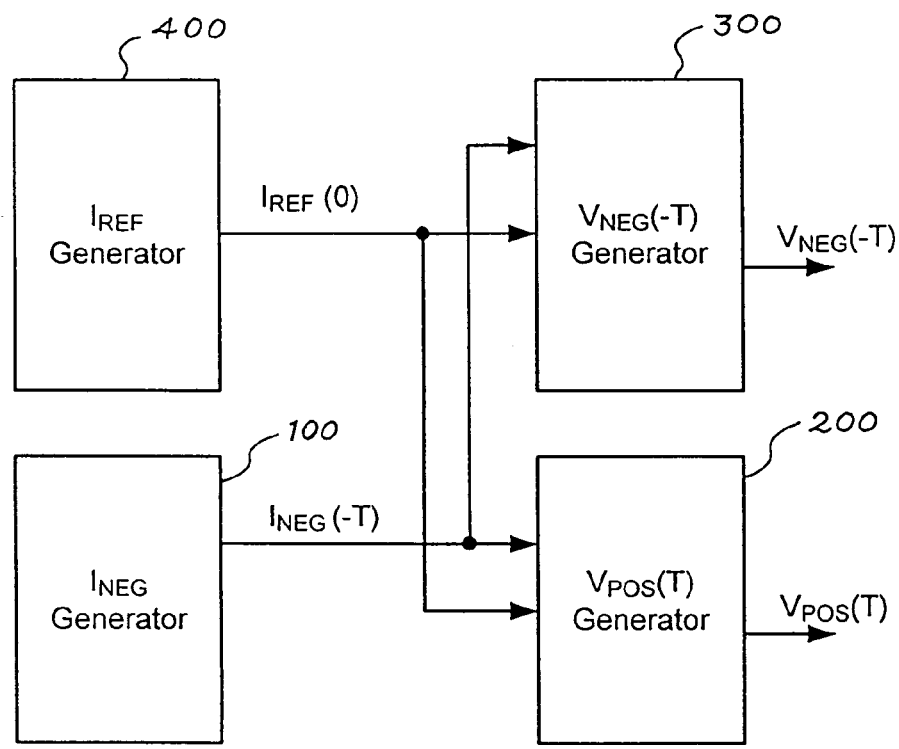
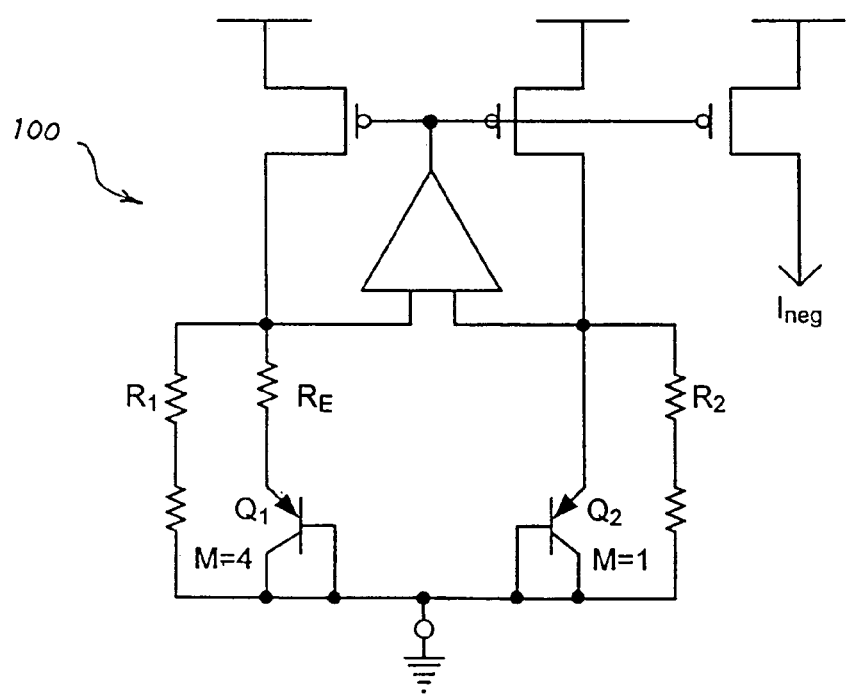
*Fig. 5*

METHOD AND SYSTEM FOR TEMPERATURE COMPENSATION FOR MEMORY CELLS WITH TEMPERATURE-DEPENDENT BEHAVIOR

BACKGROUND

Memory device manufacturers often desire to guarantee that a certain number of memory cells in a memory array will work when the memory array is used at almost any temperature. To achieve this, a memory device manufacturer tests a set of memory arrays to sort out those that do not have a minimum number of reliable memory cells. In operation, a number of test memory cells in a memory array are written to and read from, and those memory arrays whose test memory cells do not perform as desired are discarded. However, such sorting is difficult when the behavior of the memory cells varies across temperature and the memory cells are tested at a single temperature setting. For example, if a memory cell is more difficult to program or read at colder temperatures than at warmer temperatures, the number of memory cells that will fail increases as temperature decreases. Accordingly, the fact that a memory array passes the memory device manufacturer's test at a single temperature setting does not guarantee that the memory array will perform as desired when used in the field at lower temperatures.

There is a need, therefore, for a method and system for temperature compensation that will allow a memory device manufacturer to more reliably sort memory arrays.

SUMMARY

The present invention is defined by the following claims, and nothing in this section should be taken as a limitation on those claims.

By way of introduction, the preferred embodiments described below provide a method and system for temperature compensation for memory cells with temperature-dependent behavior. In one preferred embodiment, at least one of a first temperature-dependent reference voltage comprising a negative temperature coefficient and a second temperature-dependent reference voltage comprising a positive temperature coefficient is generated. One of a wordline voltage and a bitline voltage is generated from one of the at least one of the first and second temperature-dependent reference voltages. The other of the wordline and bitline voltages is generated, and the wordline and bitline voltages are applied across a memory cell. Other methods and systems are disclosed for sensing a memory cell comprising temperature-dependent behavior, and each of the preferred embodiments can be used alone or in combination with one another.

The preferred embodiments will now be described with reference to the attached drawings.

BRIEF DESCRIPTION OF THE DRAWINGS

FIG. 4 is a block diagram of a system for generating temperature-dependent reference voltages of a preferred embodiment.

FIG. 5 is a circuit implementation of an $I_{NEG}$ generator of a preferred embodiment.

DETAILED DESCRIPTION OF THE PRESENTLY PREFERRED EMBODIMENTS

The preferred embodiments described herein relate to memory cells with temperature-dependent behavior. It should be noted that any suitable type of memory cell can be used. For example, the memory cell can be write-many or write-once, can be arranged in a two-dimensional or three-dimensional memory array, and can be made from any suitable material (e.g., semiconductor, phase-change, amorphous solids, MRAM, or organic passive elements). U.S. patent application Ser. No. 09/927,648 describes a suitable write-many memory cell, and U.S. Pat. Nos. 6,034,882 and 6,420,215 describe suitable write-once memory cells, as well as suitable techniques for forming a three-dimensional memory array. Each of those patent documents is assigned to the assignee of the present invention and is hereby incorporated by reference. Many of the embodiments described herein will be illustrated with reference to a memory cell comprising a PN diode in series with an antifuse, as described in the '882 and '215 patents. However, any other type of memory cell, such as a Flash memory cell, can be used with these embodiments. Further, while the embodiments will be described in terms of a non-volatile memory cell, volatile memory cells can also be used. The claims should not be read as requiring a specific type of memory cell unless explicitly recited therein.

To program a memory cell comprising a PN diode in series with an antifuse, power is applied to forward bias the PN diode to rupture the anti-fuse layer. A diode/anti-fuse memory cell has a predictable temperature-dependent behavior: for a constant voltage applied across the memory cell, it is more difficult to program or read the cell at colder temperatures than at warmer temperatures. From a device physics point of view, the reason for this is that power equals voltage multiplied by current (P=V*I), and the forward bias diode current is temperature dependent (I=a exp(−V/kT)). Accordingly, as current decreases with temperature, the power delivered to the anti-fuse also decreases. This lower power at lower temperatures can result in a "failed bit" (i.e., a memory cell that is not programmed as intended). The same situation exists when reading a memory cell because a memory cell is read by applying a forward biased diode current to the memory cell (i.e., at lower temperature, a sense amplifier could misinterpret the memory cell as being unprogrammed when, in fact, it has been programmed).

Figure 1:
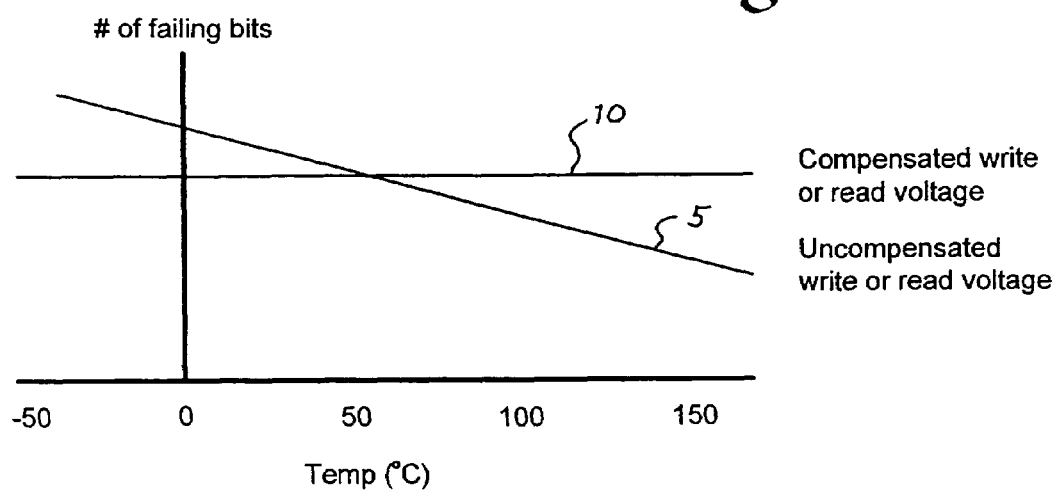
FIG. 1 is a graph of a number of failing bits versus temperature for uncompensated and compensated write or read voltages of a preferred embodiment.

To ensure that enough power is applied to the memory cell at lower temperatures to avoid a "failed bit" situation, the voltage across the memory cell can be increased at lower temperatures to compensate for the lower current, thereby providing sufficient power to write/read the memory cell. With reference to the graph shown in FIG. 1, line 5 shows that the number of failing bits increases as temperature decreases when "uncompensated" write or read voltages are used (i.e., when the same write or read voltage is applied to a memory cell across temperature). However, as shown by line 10, the number of failing bits is constant over temperature when "compensated" write or read voltages are used (i.e., when the write or read voltage applied to a memory cell varies across temperature). Not only does this provide for a more reliable memory device (because the reduction in the number of failing bits at cold temperatures reduces the overall defects per million (DPM) of the memory device, thereby increasing yield), but it also allows a memory device manufacturer to reliably sort out bad memory arrays by testing at a single temperature setting. As described in the background section above, because memory arrays are typically tested at a single temperature setting, the fact that a memory array passes a reliability test at one temperature does not guarantee that the memory array will perform as desired when used in the field at lower temperatures. However, by using a temperature compensation mechanism in which write/read voltage increases as temperature decreases (instead of applying the same write/read voltage across temperature), the number of failing bits is independent of temperature. Accordingly, if the memory array is reliable at one tested temperature, the memory array will likely be reliable when used at almost any temperature.

Figure 2:
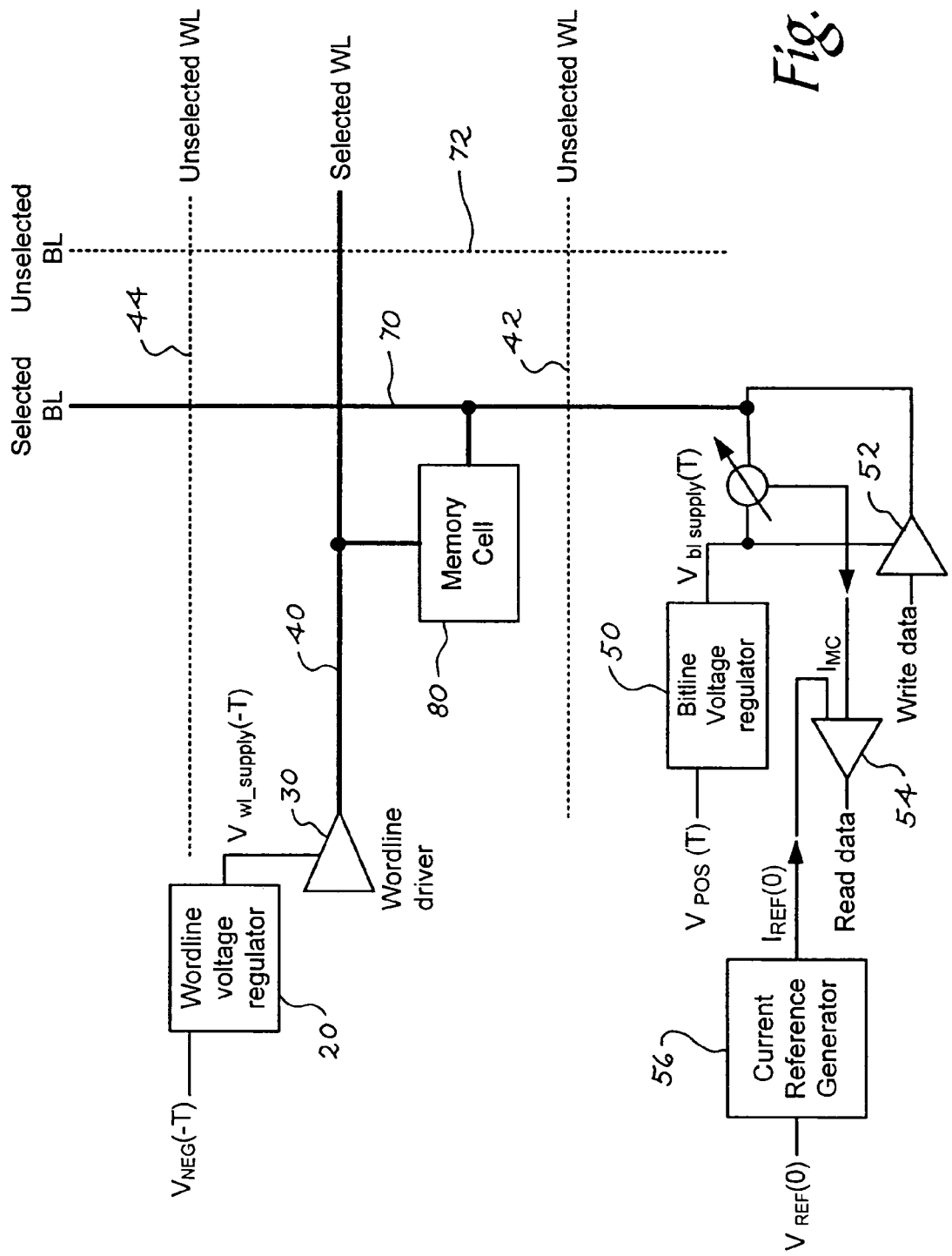
FIG. 2 is a block diagram of a system of a preferred embodiment.

As described above, by using a temperature compensation method, the number of failing bits in a memory array is independent of temperature. One way to implement a temperature compensation method is to introduce a reference voltage that has a temperature dependence and use this reference to generate the voltage across a memory cell that compensates for any temperature effect. FIG. 2 is a block diagram of a system of a preferred embodiment for implementing such a temperature compensation mechanism. As shown in FIG. 2, this system comprises a wordline voltage regulator 20 and a wordline driver 30 coupled to a wordline 40, and a bitline voltage regulator 50, a bitline word driver 52, and a current voltage sensing amplifier 54 coupled to a bitline 70. Also coupled to the current voltage sensing amplifier 54 is a current reference generator 56. A non-volatile memory cell 80 is coupled to the wordline 40 and bitline 70. $V_{NEG}$ and $V_{POS}$ generators (not shown) supply the wordline voltage regulator 20 and bitline voltage regulator 50 with reference voltages $V_{NEG}(-T)$ and $V_{POS}(T)$, respectively. It should be noted that FIG. 2 shows only part of a memory array, with some of the unselected wordlines 42, 44 and bitlines 72 shown in phantom. Additional memory cells, wordlines, bitlines, drivers, receivers, and/or regulators are not shown in FIG. 2 for simplicity.

Figure 3:
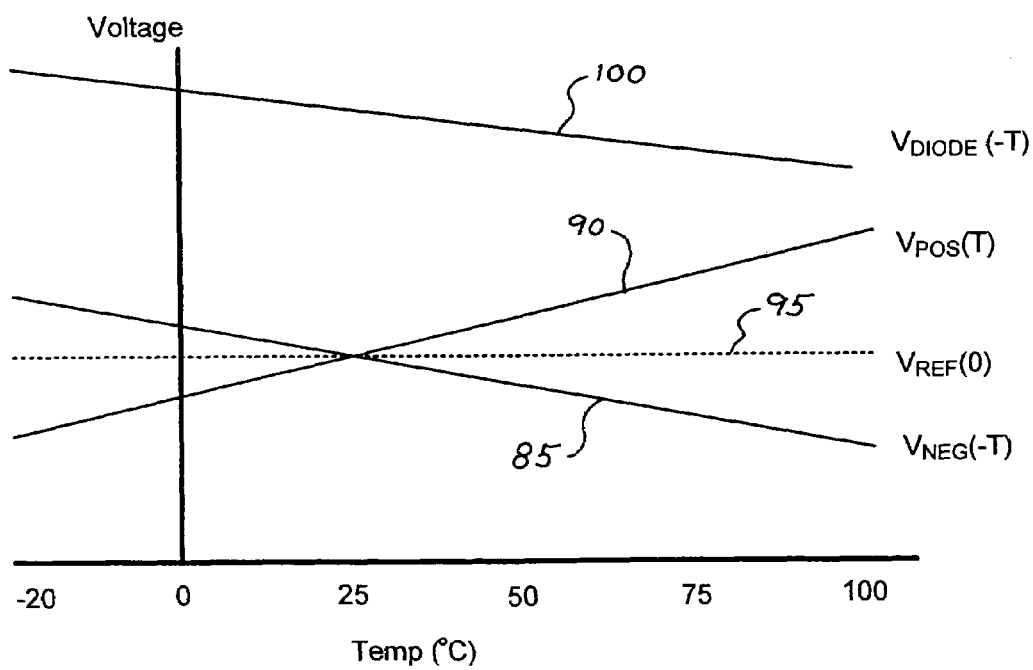
FIG. 3 is a graph of voltage versus temperature of a preferred embodiment.

The basic operation of temperature compensation in this embodiment relies on the use of two temperature-dependent reference voltages, which are referred to in FIG. 2 as $V_{NEG}(-T)$ and $V_{POS}(T)$. $V_{NEG}(-T)$ denotes a reference voltage that has a negative temperature coefficient, and $V_{POS}(T)$ denotes a reference voltage that has a positive temperature coefficient. Lines 85 and 90 in the graph of FIG. 3 show the temperature dependence and slope of $V_{NEG}(-T)$ and $V_{POS}(T)$, respectively. (For comparison purposes, line 95 in FIG. 3 shows $V_{REF}(0)$, which is a reference voltage that has zero temperature coefficient. When $V_{REF}(0)$ is used, the voltage across the memory cell 80 is constant and provides the uncompensated write/read case shown by line 5 in FIG. 1. In one implementation, $V_{REF}(0)$ is 1.25V at room temperature.)

$V_{NEG}(-T)$ and $V_{POS}(T)$ are generated by voltage generators (not shown) and are supplied to the wordline and bitline voltage regulators 30, 50. The wordline voltage regulator 20 generates and regulates the voltage supply for the wordline driver 30. This voltage is directly proportional to $V_{NEG}(-T)$. That is, $V_{Wl\_supply} = K*V_{NEG}(-T)$, where K is a constant that can be different for read and write modes. The wordline driver 30 brings the selected wordline to $V_{Wl\_supply}$. In read mode, the bitline current sense amplifier 54 is enabled, and the bitline write driver 52 is disabled. The bitline voltage regulator 50 generates the voltage reference. This reference is used to produce a voltage onto the bitline 70: Vbl_supply $(T)=L_{READ}*Vpos(T)$, where $L_{READ}$ is a constant. The voltage across the memory cell 80 is therefore, Vdiode(-T) =Vwl_Supply(-T)-Vbl_supply(T). With Vdiode(-T) across the memory cell 80, the current measured from the selected memory cell 80 is $I_{MC}$. $I_{MC}$ has a temperature coefficient approaching 0 due to the voltage compensation applied across the memory cell 80. That is, $I_{MC}$ is effectively the same across temperature. The measured $I_{MC}$ is then compared with a current reference, $I_{REF}$. If $I_{MC}$ is greater than $I_{REF}$, then the memory cell 80 is interpreted as programmed. If $I_{MC}$ is less than $I_{REF}$, then the memory cell 80 is interpreted as unprogrammed. In write mode, the bitline write driver 52 is enabled, and the bitline sense amplifier 54 is disabled. The bitline voltage regulator 50 generates the voltage reference. This reference is used to produce a voltage onto the bitline: Vbl_supply(T)=$L_{WRITE}*Vpos(T)$, where $L_{WRITE}$ is a constant. The voltage across the memory cell 80 is therefore, Vdiode(-T)=Vwl_supply(-T)-Vbl_supply(T).

By way of example, in the read mode of one presently preferred implementation, the wordline 40 is driven to 2.3V, and the bitline 70 is driven to 0.3V. The wordline voltage regulator 20 produces the 2.3V applied to the wordline 40 by using a simple voltage divider to regulate the input reference voltage $V_{NEG}(-T)$: $V_{wl\_supply}=(R1+R2)/R2*V_{NEG}(-T)$. If $V_{NEG}(25C)=1.25V$, $(R1+R2)/R2=1.84$. Similarly, the bitline voltage regulator 50 produces the 0.3V applied to the bitline 70 by using a simple voltage divider to regulate the input reference voltage $V_{POS}(T)$: $V_{BITLINE}=R2/(R1+R2)*V_{POS}(T)$. If $V_{POS}(25C)=1.25V$, $R2/(R1+R2)=0.24$.

In this embodiment, the temperature-dependent reference voltages are used to generate a condition across the memory cell 80 that cancels out the temperature-dependent behavior of the memory cell 80. The voltage across the memory cell is given by the following equation: $V_{DIODE}(-T)=V_{wl\_supply}(-T)-V_{bl\_supply}(T)$. Substituting the above terms for $V_{wl\_supply}(-T)$ and $V_{bl\_supply}(T)$, $V_{DIODE}(-T)=K*V_{NEG}-L*V_{POS}$. This is the voltage applied across the memory cell, where K can be different for read and write mode. Similarly, L can be different for read and write mode.

As shown by line 100 in FIG. 3, when the regulated wordline and bitline voltages are applied across the memory cell 80, the voltage across the diode of the memory cell 80 ($V_{DIODE}$) will have a negative temperature coefficient since $V_{DIODE}=V_{WORDLINE}-V_{BITLINE}$. $V_{DIODE}$'s negative slope across temperature compensates for the memory cell's 80 temperature-dependent behavior by providing a higher voltage across the memory cell 80 at lower temperatures. This compensation cancels the drift shown by line 5 in FIG. 1 and achieves the constant bit failure rate shown by line 10. (In contrast, if Vref(0) is used in place of $V_{POS}(T)$ and $V_{NEG}(-T)$, then $V_{DIODE}(0)$ would be constant across temperature. $V_{DIODE}(0)=K*Vref-L*Vref$. Hence, there will be no compensation for any temperature effect in the memory cell.)

Although $V_{NEG}(-T)$ and $V_{POS}(T)$ can be generated in any suitable manner, FIGS. 4–7 will now be discussed to illustrate a presently preferred way to generate those temperature-dependent reference voltages. FIG. 4 is a block diagram showing the components that can be used to generate $V_{NEG}(-T)$ and $V_{POS}(T)$. These components include an $I_{NEG}$ generator 100, a $V_{POS}(T)$ generator 200, a $V_{NEG}(-T)$ generator 300, and an $I_{REF}$ generator 400. In this embodiment, $V_{POS}$ and $V_{NEG}$ are generated from two independent current sources: the $I_{REF}$ generator 400 and the $I_{NEG}$ generator 100. The $I_{REF}$ generator 400 is a current source with zero temperature coefficient, i.e., $I_{REF}$ remains constant across temperature ($I_{REF}=C_1$, where $C_1$ is a positive constant). The $I_{REF}$ generator 400 can be represented as an ideal current source. The $I_{NEG}$ generator 100 is a current source with a negative temperature coefficient. i.e., the current linearly decreases as temperature increases ($I_{NEG}=-C_2T+C_3$, where $C_2$ and $C_3$ are positive constants). As shown in FIG. 4, the $I_{NEG}$ generator 100 provides $I_{NEG}$ to the $V_{POS}(T)$ and $V_{NEG}(-T)$ generators 200, 300, and the $I_{REF}$ generator 400 provides $I_{REF}$ to the $V_{POS}(T)$ and $V_{NEG}(-T)$ generators 200, 300. From these inputs, the $V_{POS}(T)$ and $V_{NEG}(-T)$ generators 200, 300 generate $V_{POS}(T)$ and $V_{NEG}(-T)$, respectively.

Figure 6:
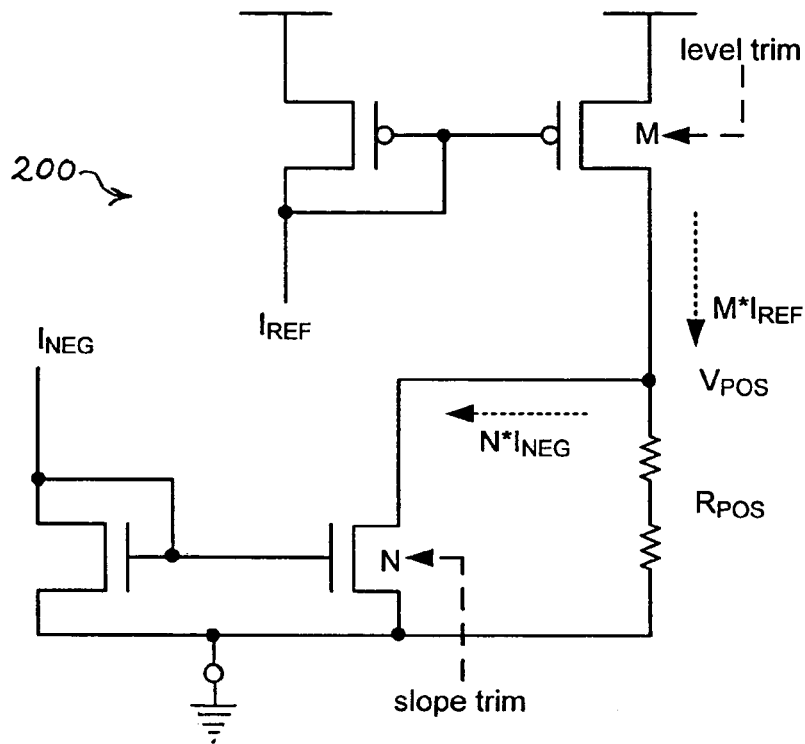
FIG. 6 is a circuit implementation of a $V_{POS}$ generator of a preferred embodiment.
Figure 7:
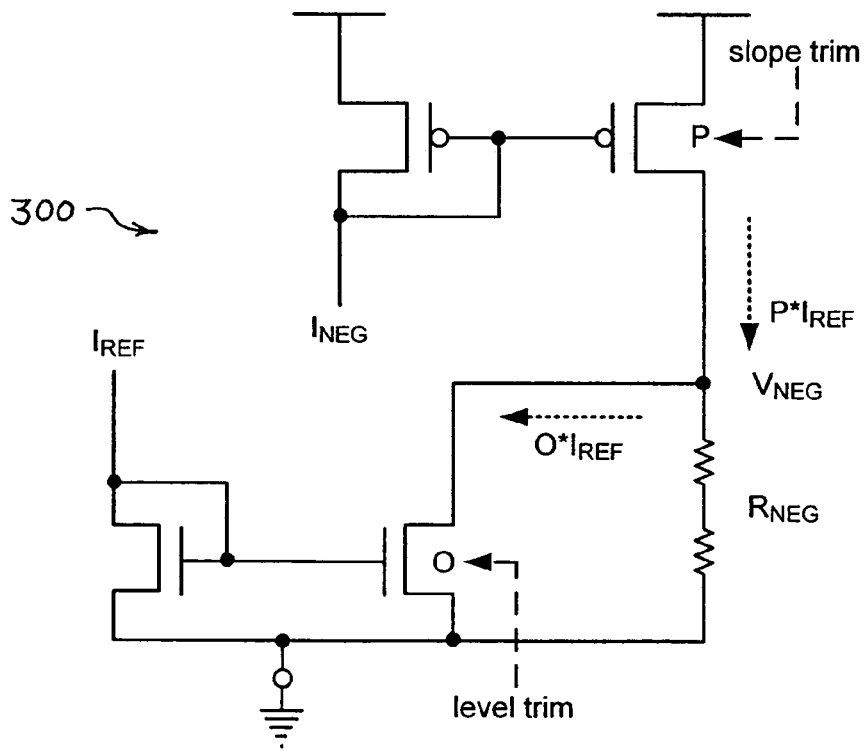
FIG. 7 is a circuit implementation of a $V_{NEG}$ generator of a preferred embodiment.

FIGS. 5, 6, and 7 show CMOS circuit implementations of the $I_{NEG}$ generator 100, the $V_{POS}$ generator 200, and the $V_{NEG}$ generator 300, respectively. With reference first to FIG. 5, the following equations illustrate how the $I_{NEG}$ generator 100 generates a current with a negative temperature coefficient.

$$I_{Q1} = \Delta V_{BE} / R_E$$

$$I_{R1} = I_{R2} = V_{BE2} / R_2$$

$$I_{NEG} = I_{R1} + I_{Q1}$$

$$I_{NEG} = (V_{BE2} / R_2) + (\Delta V_{BE} / R_E)$$

$$\frac{d I_{NEG}}{dT} = (dV_{BE2}/dT)*1/R_2 - \quad \text{[Term 1: this is a negative value.]}$$
$$(V_{BE}/R_2^2)*(dR_2/dT) + \quad \text{[Term 2: this is a negative value.]}$$
$$(d\Delta V_{BE}/dT)*1/R_E - \quad \text{[Term 3: this is a positive value.]}$$
$$(\Delta V_{BE}/R_2^2)*(dR_E/dT) \quad \text{[Term 4: this is a negative value.]}$$

The term $dI_{NEG}/dT$ shows $I_{NEG}$'S temperature dependence. $R_2$ and $R_E$ can be adjusted such that |(Term 1+Term 2+Term 4)|>| Term 3|, hence $dI_{NEG}/dT$ will have a negative temperature coefficient. Also, the terms $dR_2/dT$ and $dR_E/dT$ show that the $I_{NEG}$ generator 100 comprises resistors whose resistance values are temperature dependent. $I_{NEG}$ with a negative temperature coefficient can still be achieved even when temperature-independent resistors are used. In this case, Term 2 and Term 4 are equal to zero. For $dI_{NEG}/dT$ to be negative, $R_2$ and $R_E$ can be adjusted such that |Term 1|>|Term 3|.

Turning now to FIG. 6, the following equations illustrate how the $V_{POS}$ generator 200 generates a voltage with a positive temperature coefficient. In these equations, M is used to adjust $I_{pos}$ to desire voltage level, and N is used to adjust $I_{pos}$ to a desire slope (across temperature).

$$V_{POS} = (M*I_{REF}*R_{POS} - (N*I_{NEG}*R_{POS})$$

$$\frac{dV_{POS}}{dT} = M*I_{REF}*(dR_{POS}/dT) - \quad \text{[Term 1: This is a positive value.]}$$
$$N*(dI_{NEG}/dT)*R_{POS} - \quad \text{[Term 2: This is a positive value.]}$$
$$N*I_{NEG}*(dR_{POS}/dT) \quad \text{[Term 3: This is a negative value.]}$$

The term $dV_{POS}/dT$ shows $V_{POS}$'s temperature dependence. Because there are more terms in the equation that have a positive value than a negative value, $dV_{POS}/dT$ will have a positive temperature coefficient. Also, the term $dR_{POS}/dT$ shows that the $V_{POS}$ generator 200 comprises a resistor whose resistance value is temperature dependent. $V_{POS}$ with a positive temperature coefficient can still be achieved even when temperature-independent resistors are used. In this case, Term 1 and Term 3 are equal to zero. Since Term 2 is a positive value, $dV_{POS}/dT$ will be positive.

With reference to FIG. 7, the following equations illustrate how the $V_{NEG}$ generator 300 generates a voltage with a negative temperature coefficient. In these equations, O is used to adjust $I_{pos}$ to a desire current level, and P is used to adjust $I_{pos}$ to a desire slope (across temperature).

$$V_{NEG} = (P*I_{NEG}*R_{NEG}) - (O*I_{REF}*R_{NEG})$$

$$\frac{dV_{NEG}}{dT} = P*(dI_{NEG}/dT)*R_{NEG} + \quad \text{[Term 1: This is a negative value.]}$$
$$P*I_{NEG}*(dR_{NEG}/dT) - \quad \text{[Term 2: This is a positive value.]}$$
$$O*I_{REF}*(dR_{NEG}/dT) \quad \text{[Term 3: This is a negative value.]}$$

The term $dV_{NEG}/dT$ shows $V_{NEG}$'s temperature dependence. Because there are more terms in the equation that have a negative value than a positive value, $dV_{NEG}/dT$ will have a negative temperature coefficient. Also, the term $dR_{NEG}/dT$ shows that the $V_{NEG}$ generator 300 comprises a resistor whose resistance value is temperature dependent. $V_{NEG}$ with a negative temperature coefficient can still be achieved even when temperature-independent resistors are used. In this case, Term 2 and Term 3 are equal to zero. Since Term 1 is a negative value, $dV_{NEG}/dT$ will be negative.

To test the slopes for $V_{POS}$ and $V_{NEG}$, it is preferred that voltages be obtained at two temperatures and that a straight line be drawn through the two points. Preferably, the two points are obtained at V(T=25C) and V(T=−273C). V(T=25C) can be measured directly at room temperature, and V(T=−273C) can be accurately calculated. For example, $V_{POS}$ (T=−273C) can be calculated as follows:

$$I_{NEG} = (V_{BE2}/R_2) + (\Delta V_{BE}/R_E)$$

$$V_{POS} = (M*I_{REF}*R_{POS}) - (N*I_{NEG}*R_{POS})$$

$$= V_1 - V_2$$

$$V_1(T=-273C) = M*I_{REF}(T=-273C)*R_{POS}(T=-273C)$$

$$*I_{REF} = V_t(\ln m)/R$$

$*$Therefore, $V_1(T=-273C)=0V$ $$V_2(T=-273C) = [N*((V_{BE2}/R_2) + (\Delta V_{BE}/R_E))*R_{POS}]$$

$*$At $T=-273C$, $\Delta V_{BE}(T=-273C)=0 \cdot V_{BE2}(T=-273C)$ is $1.25V$.

$$V_2(T=-273C) = N*1.25V*(R_{POS}/R_2)$$

$*$Since we know $R_{POS}/R_2$ and $N$, we can solve for $V_2(T=-273C)$.

Therefore, we can calculate: $V_{POS}$ (T=−273C)

It should be noted that, while two temperature-dependent reference voltages were used in the embodiments described above, temperature compensation can also be achieved if a single temperature-dependent reference voltage is used. In one configuration, $V_{NEG}(-T)$ can be used for wordline regulator reference, and $V_{REF}(0)$ can be used instead of $V_{POS}(T)$ for bitline regulator reference. This configuration can achieve a voltage across the memory cell with a negative temperature coefficient. Similarly, in another configuration, $V_{REF}(0)$ can be used for wordline regulator reference instead of $V_{REF}(0)$, and $V_{POS}(T)$ can be used for bitline regulator reference. As with the other configuration, this configuration can achieve a voltage across the memory cell with a negative temperature coefficient. Accordingly, this method for temperature compensation for a memory cell with temperature-dependent behavior comprises the acts of: (a) generating at least one of a first temperature-dependent reference voltage comprising a negative temperature coefficient and a second temperature-dependent reference voltage comprising a positive temperature coefficient, (b) generating one of a wordline voltage and a bitline voltage from one of the at least one of the first and second temperature-dependent reference voltages, (c) generating the other of the wordline and bitline voltages, and (d) applying the wordline and bitline voltages across a memory cell.

There are several other alternatives that can be used with these embodiments. Before turning to these alternatives, a summary of some of the preferred embodiments described above is presented. In the above embodiments, the voltage across the memory cell is varied so that the memory cell's behavior is the same regardless of temperature. To do this, the memory cell's behavior across temperature is characterized to determine its temperature dependency. Once the slope needed to compensate for the temperature-dependent behavior is determined, either $V_{POS}$, $V_{NEG}$ or both can be trimmed to desire values. In read mode, the voltage sensing amplifier 60 compares the reference voltage with the voltage sensed back from the memory cell 80. If $V_{MC}$ is greater than $V_{BL\_REF}(T)$, the memory cell is programmed; otherwise, it is unprogrammed. Since $V_{MC}$ is higher at hot than at cold, $V_{BL\_REF}(T)$ would also be lower at cold and higher at hot for proper tracking. In write mode, it is more difficult to program at cold than at hot. Therefore, it is preferred that the voltage across the memory cell be increased at cold and that more power be delivered to the memory cell 80 for better programming conditions. Similarly, it is preferred that the voltage across the memory cell 80 be decreased at hot and that less power be delivered such that the same programmability is achieved across all temperature. The advantage of this embodiment is that the user has full control over the degree of compensation. However, in this embodiment, the temperature dependency of the memory cell needs to be characterized before the slope of the voltage references can be set.

Figure 8:
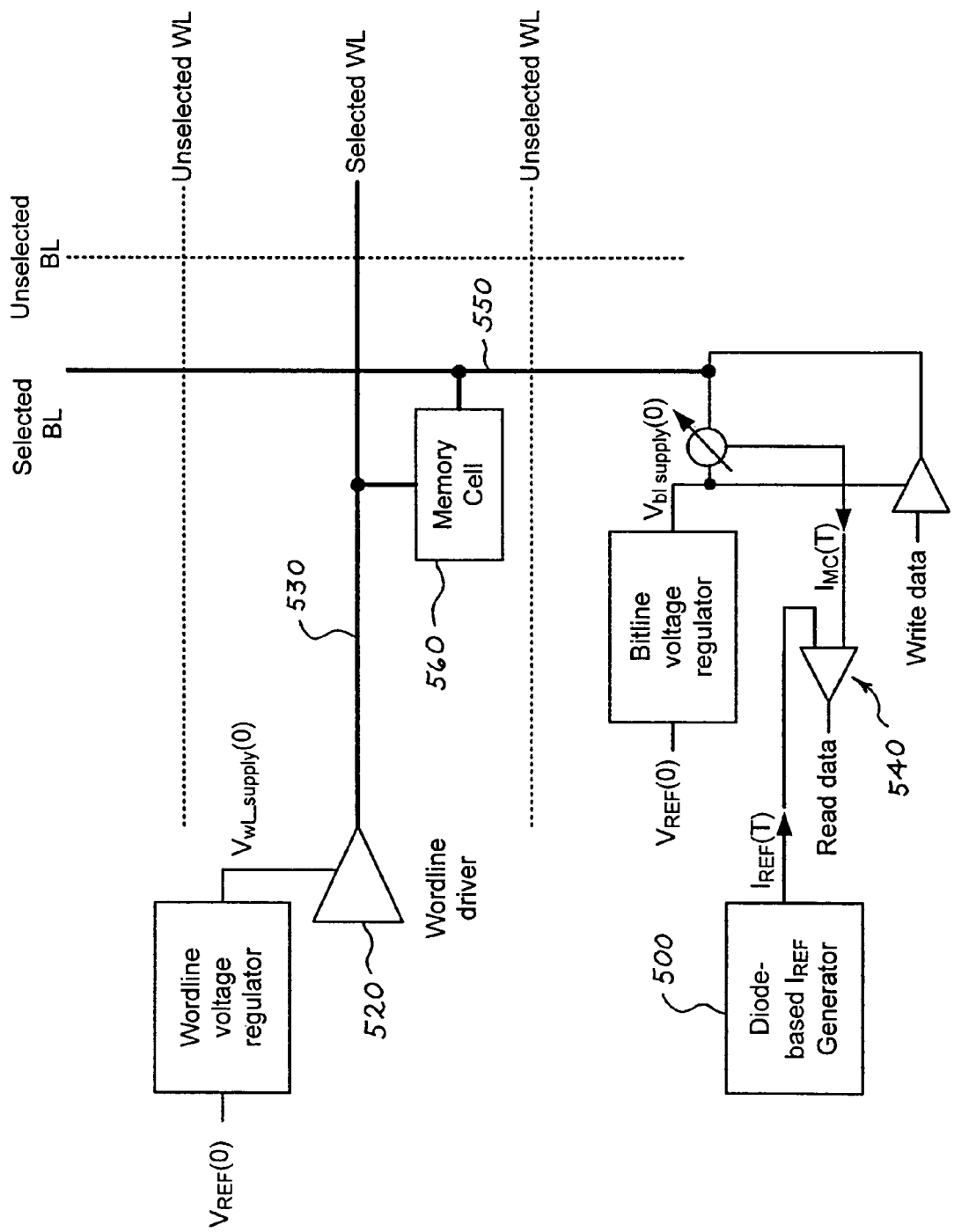
FIG. 8 is a block diagram of a system of a preferred embodiment in which a diode-based $I_{REF}$ generator is used to generate a reference current for sensing a memory cell.

In one alternate embodiment, instead of varying voltage across a memory cell to compensate for the memory cell's temperature-dependent behavior, a current that has some relationship with temperature is used as a reference for sensing a memory cell. This embodiment will be illustrated in conjunction with the block diagram of FIG. 8, which shows a diode-based $I_{REF}$ generator 500, a wordline driver 520 coupled to a wordline 530, a current sensing amplifier 540 coupled to a bitline 550, and a memory cell 560 coupled to the wordline 530 and bitline 550. In operation, the current sensing amplifier 540 compares a reference current generated by the diode-based $I_{REF}$ generator 500 with the current sensed back from the memory cell 560 during a read operation. For example, if the memory cell 560 is programmed, $I_{MC}$ would be much higher than if the memory cell 560 were not programmed. If $I_{MC}(T)$ is higher than $I_{REF}(T)$, then the current sensing amplifier 540 will detect a programmed cell; otherwise, it will detect an unprogrammed cell. At cold (e.g., −25° C.), $I_{MC}(T)$ could be very small even when the memory cell 560 is programmed. Therefore, it is preferred that $I_{REF}(T)$ track the temperature effect to guarantee we are sensing the intended state stored in the memory cell. If $I_{REF}(0)$ is constant across temperature, for a programmed cell at cold, it could be misinterpreted as an unprogrammed cell. Similarly, at hot (e.g., 85° C.), $I_{MC}(T)$ could be very high even for unprogrammed cells. Therefore, it is preferred that $I_{REF}(T)$ be higher for proper tracking.

Figure 9:
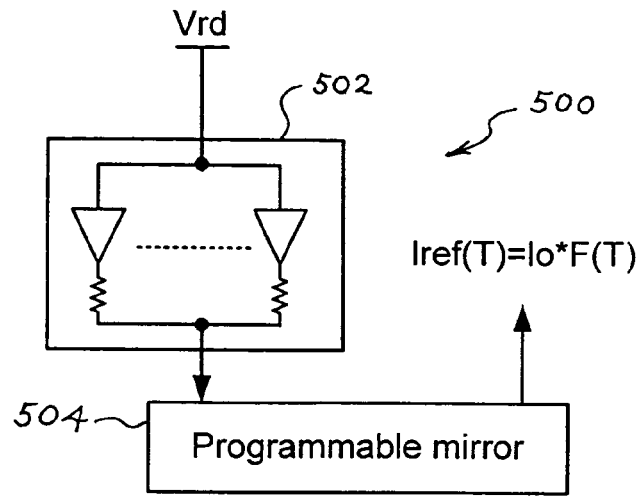
FIG. 9 is a block diagram of a diode-based $I_{REF}$ generator of a preferred embodiment.

While any suitable circuit can be used, FIG. 9 is a block diagram of preferred circuit implementation of the diode-based $I_{REF}$ generator 500. As shown in FIG. 9, the system comprises a set of "dummy" memory cells 502 and a programmable mirror 504. In this embodiment, a constant voltage Vrd is applied to the set of dummy memory cells 502 to generate a current reference. The total current from the set of dummy memory cells 502 is averaged out, and the programmable mirror 504 is trimmed to the desire level. $I_{REF}(T) = [1/N * \Sigma^N I_{MC(I)}(T)] * C$, where N is the number of dummy memory cell in the set 500. C is the trimming factor to set $I_{REF}(25° C.)$ to the desired level, which, in one presently preferred implementation, is 1.5 µA. This set of dummy memory cells 502 will track any temperature effect that the rest of the memory array will experience.

One advantage associated with this embodiment is that the temperature-dependent behavior of the memory cell does not need to be characterized across temperature since the dummy memory cells can be trusted to have full tracking ability. However, while this embodiment works well in read mode, it will not be able to cancel out the temperature effect in the memory cell in write mode (i.e., it will still be more difficult to program the memory cell at colder temperatures than at warmer temperatures). Nevertheless, in programming a memory cell, the generated current reference from the set of dummy memory cells 500 can be used to generate the write voltage needed to program the cell. The generated write voltage will have some relationship with temperature that will track the diode/antifuse temperature effect.

Figure 11:
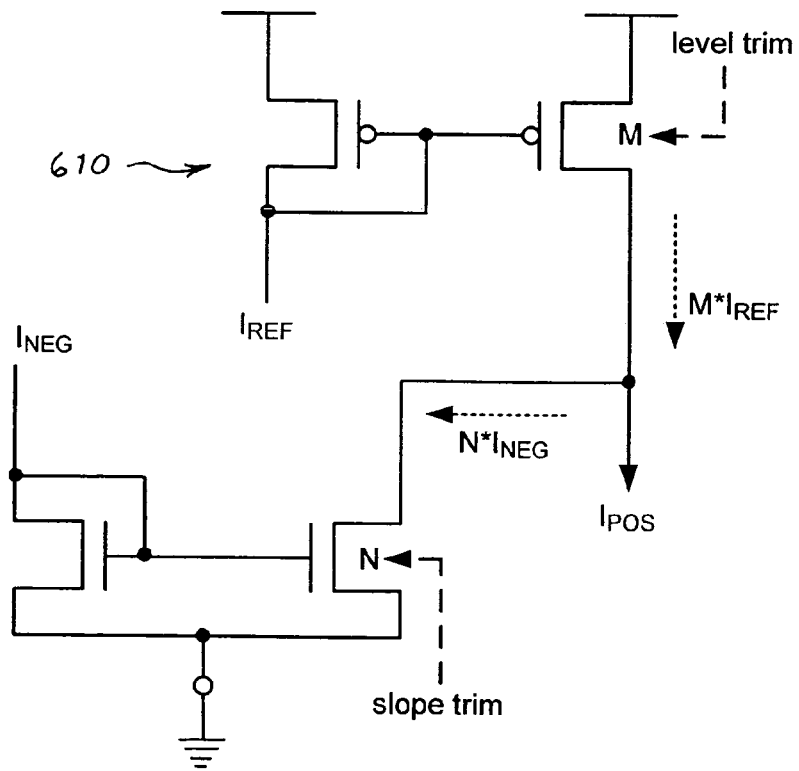
FIG. 11 is a circuit implementation of the $I_{POS}$ generator of FIG. 10.
Figure 10:
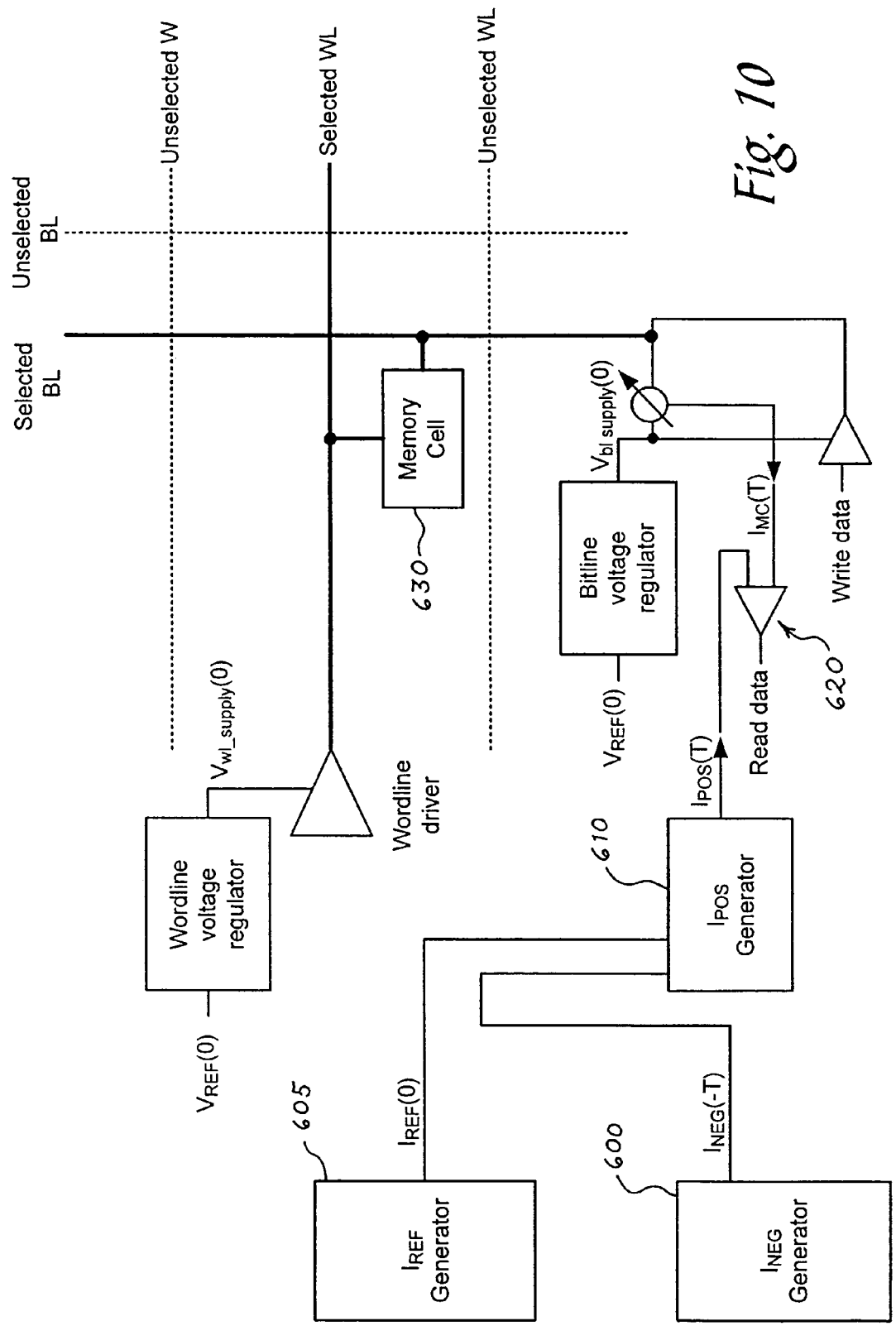
FIG. 10 is a block diagram of a system of a preferred embodiment in which a circuit is used to generate a temperature-dependent reference current.

Another alternate embodiment is shown in FIG. 10. This alternate embodiment is similar to the one shown in FIG. 8; however, instead of using a set of dummy memory cells to track the temperature effect, a circuit is used to generate the temperature dependency. As shown in FIG. 10, this alternate embodiment comprises an $I_{NEG}$ generator 600, an $I_{REF}$ generator 605, an $I_{POS}(T)$ generator 610, a current sensing amplifier 620, and a memory cell 630. The two independent current sources ($I_{REF}$ and $I_{NEG}$) are the same components described above. FIG. 11 shows a circuit implementation of the $I_{POS}(T)$ generator 610. $I_{POS}(T)$ is given by the following equations where M is used to adjust $I_{pos}$ to desire current level, and N is used to adjust $I_{pos}$ to a desired slope (across temperature).

$$I_{POS} = M * I_{REF} - N * I_{NEG}$$

$$\frac{dI_{POS}}{dT} = -N * (dI_{NEG}/dT) * R_{POS} + \quad \text{[Term 1: this is a positive value.]}$$

$$(M * I_{REF} - N * I_{NEG}) * (dR_{POS}/dT) \quad \text{[Term 2: this is a positive value.]}$$

In this embodiment, the temperature effect of the memory cell 630 is determined and characterized. Once the relative slope is determined, $I_{POS}(T)$ is trimmed to the desire slope. Effectively, $I_{POS}(T)$ will track any temperature effect that the rest of the memory array will experience. The current sensing amplifier compares $I_{POS}(T)$ to the current sensed back from the memory cell 630 in a read operation to determine whether the memory cell is programmed. For example, if the memory cell 630 is programmed, $I_{MC}$ will be much higher than if the memory cell were not programmed. If $I_{MC}(T)$ is higher than $I_{POS}(T)$, then the current sensing amplifier 620 detects a programmed cell; otherwise, it detects an unprogrammed cell. At cold (e.g., −25° C.), $I_{MC}(T)$ could be very small even when the memory cell 630 is programmed. Therefore, it is preferred that $I_{POS}(T)$ track the temperature effect to guarantee we are sensing the intended state stored in the memory cell. Similarly, at hot (e.g., 85° C.), $I_{MC}(T)$ could be very high even for an unprogrammed memory cell. Therefore, it is preferred that $I_{POS}(T)$ be higher for proper tracking. Note that for $I_{POS}$ generation, a resistor that is temperature independent can also be used. In this situation, in the above equation, Term 2 will go to zero, but $dI_{POS}/dT$ is still a positive value.

It should be noted that while a memory cell has an exponential relationship with temperature, $I_{POS}(T)$ only has a linear relationship with temperature. Therefore, this alternate embodiment may not be preferred when it is desired to fully compensate for a full range of temperatures. Additionally, while this embodiment performs well in read mode, it will not cancel out the temperature effect in the memory cell in write mode (i.e., it may still be more difficult to program the memory cell 630 at colder temperatures than at warmer temperatures). Further, unlike the alternate embodiment shown in FIG. 8, the temperature dependency of the memory cell 630 needs to be determined before the slope for the voltage references can be set.

Other alternatives can be used as well. For example, if a memory cell exhibits a temperature-dependent behavior that is opposite that described above (i.e., the memory cell is easier to program or read at colder temperatures than at warmer temperatures), the methods and systems described above can be adapted to compensate for this "opposite behavior" temperature effect. In another alternative, a traditional bandgap reference circuit is used such that the temperature coefficient can be tuned by adjusting the resistance in the generation core circuit. The solution can be achieved with a single generated source. In yet another alternative, a voltage reference is produced by summing two current sources times resistance. The first current source has a positive temperature coefficient (instead of negative temperature coefficient), and the second current source has a zero (or close to zero) temperature coefficient.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for temperature compensation for a memory cell with temperature-dependent behavior, the method comprising:
   (a) generating at least one of a first temperature-dependent reference voltage comprising a negative temperature coefficient and a second temperature-dependent reference voltage comprising a positive temperature coefficient;
   (b) generating one of a wordline voltage and a bitline voltage from one of the at least one of the first and second temperature-dependent reference voltages;
   (c) generating the other of the wordline and bitline voltages; and
   (d) applying the wordline and bitline voltages across a memory cell.

2. The invention of claim 1, wherein (a) comprises generating both the first and second temperature-dependent reference voltages, and wherein (c) comprises generating the other of the wordline and bitline voltages from the other of the at least one of the first and second temperature-dependent reference voltages.

3. The method of claim 1, wherein (d) is performed during a write operation.

4. The method of claim 1, wherein (d) is performed during a read operation.

5. The method of claim 1, wherein the temperature coefficient(s) of the at least one of the first and second temperature-dependent reference voltages are chosen such that a voltage across the memory cell comprises a negative temperature coefficient.

6. The method of claim 1, wherein the memory cell comprises a write-once memory cell.

7. The method of claim 1, wherein the memory cell comprises a write-many memory cell.

8. The method of claim 1, wherein the memory cell is part of a two-dimensional memory array.

9. The method of claim 1, wherein the memory cell is part of a three-dimensional memory array.

10. The method of claim 1, wherein the memory cell comprises a non-volatile memory cell.

11. A system for temperature compensation for a memory cell with temperature-dependent behavior, the system comprising:
   a first temperature-dependent reference voltage source operative to generate a first temperature-dependent reference voltage comprising a negative temperature coefficient;
   a second temperature-dependent reference voltage source operative to generate a second temperature-dependent reference voltage comprising a positive temperature coefficient;

a wordline voltage regulator operative to generate a wordline voltage from one of the first and second temperature-dependent reference voltages;

a bitline voltage regulator operative to generate a bitline voltage from the other of the first and second temperature-dependent reference voltages; and a memory cell coupled with the wordline and bitline voltage regulators.

12. The system of claim 11 further comprising:

a temperature-dependent current source operative to generate a first reference current with a negative temperature coefficient; and a temperature-independent current source operative to generate a second reference current;

wherein the first and second temperature-dependent reference voltage sources generate the first and second temperature-dependent reference voltages, respectively, from the first and second reference currents.

13. The system of claim 11, wherein at least one of the temperature-dependent current source, the first temperature-dependent reference vol second temperature-dependent reference voltage source comprises a temperature-dependent resistor.

14. The system of claim 11, wherein at least one of the temperature-dependent current source, the first temperature-dependent reference voltage source, and the second temperature-dependent reference voltage source comprises a temperature-independent resistor.

15. The system of claim 11, wherein the temperature coefficients of the first and second reference voltages are chosen such that a voltage across the memory cell comprises a negative temperature coefficient.

16. The system of claim 11, wherein the memory cell comprises a write-once memory cell.

17. The system of claim 11, wherein the memory cell comprises a write-many memory cell.

18. The system of claim 11, wherein the memory cell is part of a two-dimensional memory array.

19. The system of claim 11, wherein the memory cell is part of a three-dimensional memory array.

20. The system of claim 11, wherein the memory cell comprises a non-volatile memory cell.

21. A system for sensing a memory cell comprising temperature-dependent behavior, the system comprising:

a memory cell comprising temperature-dependent behavior;

a current sensing amplifier coupled with the memory cell; and a temperature-dependent reference current source cells coupled with the current sensing amplifier, wherein the temperature-dependent reference current source comprises a plurality of memory cells that have the same temperature-dependent behavior as the memory cell, wherein each of the plurality of memory cells generates a current when a voltage is applied to the plurality of memory cells, and wherein the temperature-dependent reference current source generates a current reference from an average of the currents generated by the plurality of memory cells;

wherein the current sensing amplifier compares the current reference to current sensed back from the memory cell during a read operation to determine whether the memory cell is programmed.

22. The system of claim 21 further comprising a programmable mirror interposed between the plurality of memory cells and the current sensing amplifier.

23. The system of claim 21, wherein the memory cell comprises a write-once memory cell.

24. The system of claim 21, wherein the memory cell comprises a write-many memory cell.

25. The system of claim 21, wherein the memory cell is part of a two-dimensional memory array.

26. The system of claim 21, wherein the memory cell is part of a three-dimensional memory array.

27. The system of claim 21, wherein the memory cell comprises a non-volatile memory cell.

28. A system for sensing a memory cell comprising temperature-dependent behavior, the system comprising:

a memory cell comprising temperature-dependent behavior;

a current sensing amplifier coupled with the memory cell;

a temperature-dependent reference current source coupled with the current sensing amplifier, the temperature-dependent reference current source operative to generate a temperature-dependent reference current comprising a positive temperature coefficient;

wherein the current sensing amplifier compares the temperature-dependent reference current to current sensed back from the memory cell during a read operation to determine whether the memory cell is programmed;

a second temperature-dependent current source, the second temperature-dependent current source operative to generate a reference current with a negative temperature coefficient; and a temperature-independent current source operative to generate a temperature-independent reference current;

wherein the temperature-dependent reference current source generates the temperature-dependent reference current from the reference current generated by the second temperature-dependent current source and the temperature-independent reference current.

29. The system of claim 28, wherein the memory cell comprises a write-once memory cell.

30. The system of claim 28, wherein the memory cell comprises a write-many memory cell.

31. The system of claim 28, wherein the memory cell is part of a two-dimensional memory array.

32. The system of claim 28, wherein the memory cell is part of a three-dimensional memory array.

33. The system of claim 28, wherein the memory cell comprises a non-volatile memory cell.

* * * * *